US008669777B2

(12) United States Patent
Kuah et al.

(10) Patent No.: US 8,669,777 B2
(45) Date of Patent: Mar. 11, 2014

(54) ASSESSING CONNECTION JOINT COVERAGE BETWEEN A DEVICE AND A PRINTED CIRCUIT BOARD

(75) Inventors: BengKit Kuah, Singapore (SG); Lucas KongYaw Lee, Singapore (SG); William L. Rugg, Longmont, CO (US); SaiPo Yuen, Singapore (SG); William B S Koh, Singapore (SG); Jui Whatt Tan, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 459 days.

(21) Appl. No.: 12/913,122

(22) Filed: Oct. 27, 2010

(65) Prior Publication Data

US 2012/0105096 A1 May 3, 2012

(51) Int. Cl.
*G01R 31/28* (2006.01)
*H05K 1/11* (2006.01)

(52) U.S. Cl.
USPC .................. 324/763.01; 174/263; 174/266

(58) Field of Classification Search
USPC .............. 361/726; 257/E21.503, 698, 693, 257/E23.068, 737, 99; 174/263, 266; 29/852
See application file for complete search history.

(56) References Cited

U.S. PATENT DOCUMENTS

| 3,369,267 | A | 2/1968 | Friedland et al. |
| 3,490,448 | A | 1/1970 | Grubb |
| 3,703,739 | A | 11/1972 | Young et al. |
| 4,470,641 | A | 9/1984 | Swarthout |
| 5,136,471 | A | 8/1992 | Inasaka |
| 5,217,919 | A | 6/1993 | Gaul et al. |
| 5,242,433 | A | 9/1993 | Smith et al. |
| 5,366,589 | A | 11/1994 | Chang |
| 5,397,733 | A | 3/1995 | Jang |
| 5,445,311 | A | 8/1995 | Trask et al. |
| 5,455,455 | A | 10/1995 | Badehi |
| 5,460,620 | A | 10/1995 | Smith et al. |
| 5,517,756 | A | 5/1996 | Shirai et al. |
| 5,547,906 | A | 8/1996 | Badehi |
| 5,594,234 | A | 1/1997 | Carter, Jr. et al. |

(Continued)

FOREIGN PATENT DOCUMENTS

JP 2000311324 A 11/2000

OTHER PUBLICATIONS

Cirrus Logic "Thermal Considerations for QFN Packaged Integraded Circuits", 2007, Cirrus Logic, Inc. pp. 1-12.*
www.ladyada.net "Multimeter Tutorial", Oct. 14, 2007.*

*Primary Examiner* — Jermele M Hollington
*Assistant Examiner* — Hoang X Nguyen
(74) *Attorney, Agent, or Firm* — Hall Estill Attorneys at Law

(57) ABSTRACT

The present disclosure relates to assessing coverage of a connection joint, such as a solder joint, between a device and a printed circuit board (PCB). In accordance with various embodiments, a PCB includes a conductive thermal pad adapted to be electrically and mechanically connected to an exposed pad of a component by an intervening connection joint to establish a thermal path to dissipate thermal energy from the component. An isolated test via that extends through the conductive thermal pad in non-contacting relation thereto, the test via adapted to mechanically and electrically contact said intervening connection joint. A coverage characteristic of the intervening connection joint can be determined in relation to application of an electrical signal to the test via.

18 Claims, 6 Drawing Sheets

(56) References Cited

U.S. PATENT DOCUMENTS

| | | |
|---|---|---|
| 5,747,377 A | 5/1998 | Wu |
| 5,875,102 A | 2/1999 | Barrow |
| 6,001,707 A | 12/1999 | Lin et al. |
| 6,078,477 A | 6/2000 | Adams et al. |
| 6,084,312 A | 7/2000 | Lee |
| 6,114,752 A | 9/2000 | Huang et al. |
| 6,117,707 A | 9/2000 | Badehi |
| 6,218,281 B1 | 4/2001 | Watanabe et al. |
| 6,258,679 B1 | 7/2001 | Burns et al. |
| 6,265,317 B1 | 7/2001 | Chiu et al. |
| 6,380,048 B1 | 4/2002 | Boon et al. |
| 6,396,129 B1 | 5/2002 | Hung et al. |
| 6,401,765 B1 | 6/2002 | Carter, Jr. et al. |
| 6,455,355 B1 | 9/2002 | Lin et al. |
| 6,602,775 B1 | 8/2003 | Chen et al. |
| 6,808,798 B2 | 10/2004 | Tobita |
| 6,992,864 B2 | 1/2006 | Kaneko et al. |
| 7,015,591 B2 | 3/2006 | Lee |
| 7,098,533 B2 | 8/2006 | Lee et al. |
| 7,154,750 B2 | 12/2006 | Li et al. |
| 7,177,147 B2 | 2/2007 | Su |
| 7,208,191 B2 | 4/2007 | Freedman |
| 7,294,007 B1 * | 11/2007 | Lawlyes et al. ............... 439/276 |
| 7,723,836 B2 * | 5/2010 | Kwon et al. .................. 257/690 |
| 2002/0066593 A1 * | 6/2002 | Burdon et al. ................ 174/261 |
| 2003/0099065 A1 | 5/2003 | Watanabe |
| 2003/0141103 A1 | 7/2003 | Ng et al. |
| 2005/0017740 A1 * | 1/2005 | Higashitani et al. ........... 324/751 |
| 2006/0131728 A1 * | 6/2006 | Salmon ........................ 257/698 |
| 2008/0186623 A1 | 8/2008 | Cayaban et al. |
| 2009/0294165 A1 | 12/2009 | Thomas |

\* cited by examiner

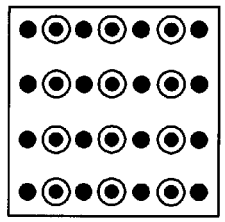
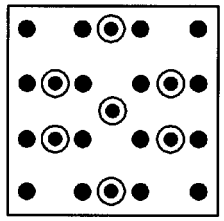
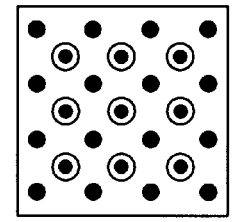
FIG. 9A  FIG. 9B  FIG. 9C
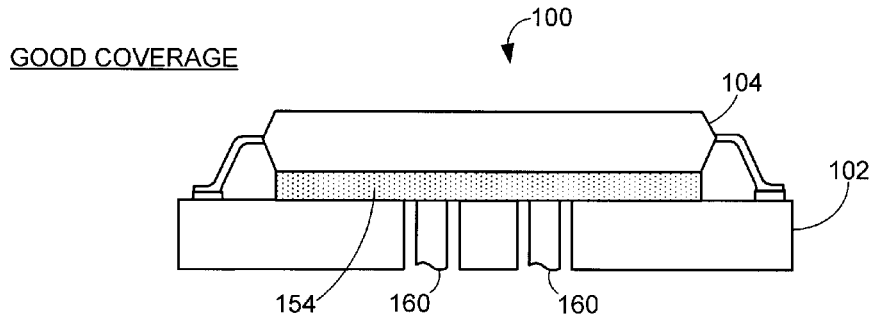
FIG. 10A
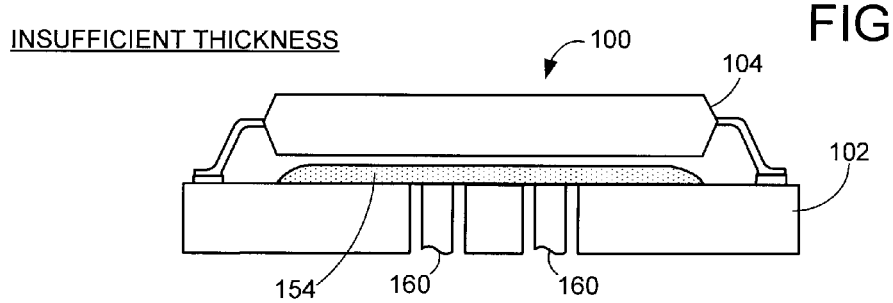
FIG. 10B
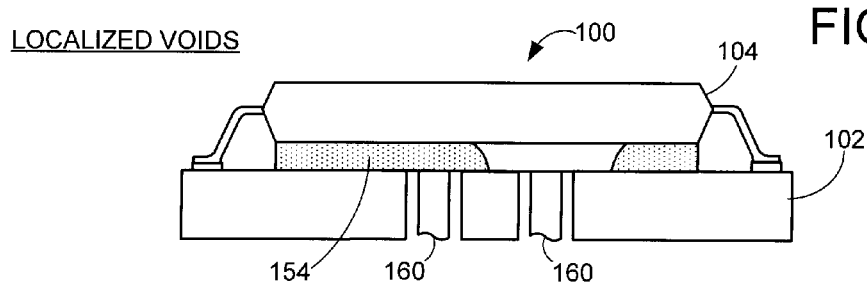
FIG. 10C

ASSESSING CONNECTION JOINT COVERAGE BETWEEN A DEVICE AND A PRINTED CIRCUIT BOARD

SUMMARY

Various embodiments of the present invention are generally directed to assessing interconnection coverage between a device and a printed circuit board (PCB).

In accordance with various embodiments, a PCB includes a conductive thermal pad adapted to be electrically and mechanically connected to an exposed pad of a component by an intervening connection joint to establish a thermal path to dissipate thermal energy from the component. An isolated test via extends through the conductive thermal pad in non-contacting relation to the conductive thermal pad. The test via is adapted to mechanically and electrically contact said intervening connection joint.

A coverage characteristic of the intervening connection joint can be determined in relation to application of an electrical signal to the test via. Generally, the test via will provide an electrical response, such as a measured electrical impedance, in relation to whether the intervening connection joint contacts the test via.

These and other features and aspects which characterize various embodiments of the present invention can be understood in view of the following detailed discussion and the accompanying drawings.

BRIEF DESCRIPTION OF THE DRAWINGS

FIGS. 9A-9C illustrate various alternative configurations for a thermal conductive pad of FIG. 2.

FIGS. 10A-10C show different coverage characteristics of an intervening connection joint.

DETAILED DESCRIPTION

Figure 1:
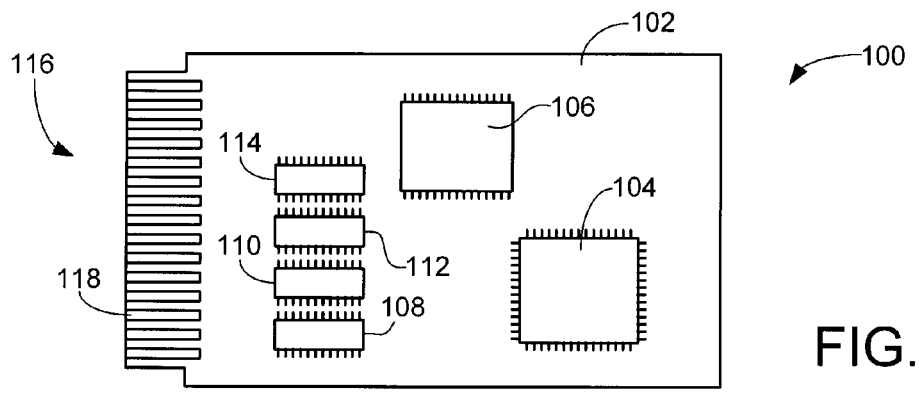
FIG. 1 depicts an exemplary printed circuit board assembly (PCBA).

The present disclosure generally relates to the manufacture of printed circuit board assemblies (PCBAs), and more particularly, to methods and devices for assessing the connection joint coverage of a thermal junction between a device and a printed circuit board (PCB) to which the device is affixed.

PCBAs are often formed by affixing various components to a printed circuit board (PCB) through the use of a mechanical interconnection process such as soldering. A PCB mechanically supports and electrically interconnects various electronic components mounted to the PCB. To this end, the PCB incorporates conductive pathways such as internal and external traces, vias (plated through holes, PTHs) and signal/ground planes that interconnect the various components. The conductive pathways are formed on one or more non-conductive substrates of the PCB, such as layers of pre-impregnated composite fibers (pre-preg) or layers of polyester film. PCBs may be relatively rigid or flexible in nature, and are particularly suited for high volume manufacturing production processes.

A continuing trend is to design PCBs with smaller form factors and higher conductive pathway densities to accommodate integrated circuit (IC) components having ever increasing levels of integration. While allowing the PCBs to achieve higher levels of performance and functionality, this also tends to increase the amount of heat that is generated by such assemblies during operation.

To accommodate the greater amounts of heat generation that can arise from such integration, some IC packages are provided with an external pad (or "epad") on the bottom side of the component. The epad is configured to be mechanically affixed to a corresponding thermal pad on the PCB through the use of a conductive interconnection joint, such as a layer of reflowed solder, to provide a thermally conductive pathway to draw away heat that is generated during the operation of the IC.

In some cases, one or more thermal vias, or vertically extending conductive pathways, can extend from the thermal pad down through the thickness of the PCB. This helps to further draw heat away from the IC to various other parts of the PCB, such as an internal or external conductive ground plane of the PCB.

It will be appreciated that the use of less than an optimum amount of interconnection material between an epad on a PCB and a thermal pad on a PCB may lead to undesired operational issues with the PCBA. For example, insufficient solder coverage between the epad and the thermal pad may result in degraded thermal dissipation from the IC, leading to potential overheating conditions and, in extreme cases, possible device failure. At the same time, too much interconnection material may inadvertently lead to electrical shorting or other apparent or latent defects in the PCBA. The interconnection material may be applied by a suitable automated process, such as solder paste applied using a solder mask, and a variety of process factors may result in large variations in the amount and location of the applied solder.

One problem with assessing the quality of a conductive joint formed between an epad and a thermal pad is that the interconnection will often be located underneath the IC component. Thus, direct visual inspection of the conductive joint may not be possible. In the past, a process control approach has sometimes been used wherein a sample of components from a production run are subjected to destructive testing (such as through the destructive bisectioning of the samples) or non-destructive testing (such as by subjecting the sample assemblies to x-ray inspection or other non-destructive techniques). While operable, these techniques are not always sufficient to ensure thermal path quality of all produced assemblies, and can be expensive and resource intensive to implement.

Accordingly, various embodiments of the present invention are generally directed to an improved printed circuit board (PCB) configuration that facilitates fast and accurate assessment of a connection joint, such as a layer of reflowed solder between the PCB and a device mounted thereto. As explained below, the PCB incorporates one or more isolated test vias that extend adjacent and in non-contacting relation to an electrically conductive pad. Each test via can be realized as a plated through hole (PTH) that is formed by plating the annular sidewall of a through-hole aperture in the PCB with conductive material which is normally electrically isolated from the rest of the PCB.

Once the electrically conductive pad has been subjected to the application of a conductive joint, the coverage of the conductive joint can be assessed by applying an electrical signal to the test via, such as by a small test current and/or voltage. The conductive joint will establish a low impedance electrical interconnection with the test via in the presence of the intervening connection material, and will not provide a low impedance electrical interconnection in the absence of the intervening connection material. In this way, the overall coverage characteristics of the interconnection can be easily assessed.

FIG. 1 represents an exemplary printed circuit board assembly (PCBA) 100 constructed and operated in accordance with various embodiments. It will be appreciated that the various embodiments presented herein can be readily adapted to any number of applications, so the particular features set forth by the PCBA 100 are merely illustrative and not limiting.

The PCBA 100 includes a printed circuit board (PCB) 102 to which a number of devices can be affixed, such as various integrated circuit (IC) components respectively denoted at 104, 106, 108, 110, 112 and 114. While not limiting, it is contemplated that these various ICs utilize surface mount technology (SMT) and lead frame packaging technology (LFPT). Each component has an internal IC chip that is encapsulated within a package body, and various conductive leads extend therefrom for contact with associated pads (not separately denoted) on the top surface of the PCB 102. For reference, the PCB 102 further includes an edge connector portion 116 having a number of exposed conductive contacts 118 to allow mating insertion with a separate board edge connector (not shown).

While not limiting, the PCB 102 constitutes a multi-layer PCB with various internal and external signal traces, vias (plated through holes, or PTHs), signal planes, and other features to establish electrically conductive paths between the various components and the edge connector contacts 118. A suitable interconnection process, such as a wave soldering or IR soldering process, can be used to establish the requisite mechanical and electrical interconnections through the application of a layer of solder paste, placement of the components, and heating of the assembly to reflow the solder. It is contemplated that the PCBA 100 is formed in a high-volume manufacturing process where a large population of nominally identical PCBAs are formed in each production run.

Figure 2:
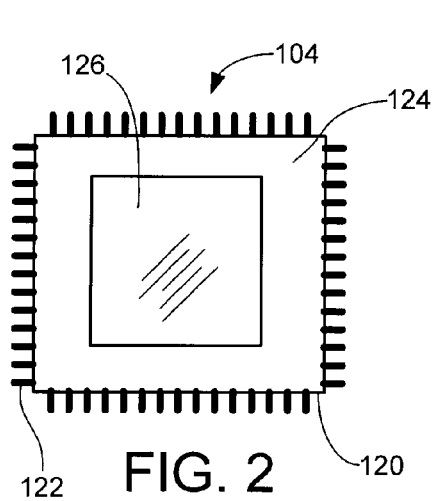
FIG. 2 shows a bottom plan view representation of a component from the PCBA of FIG. 1.

FIG. 2 shows the underside of the IC 104 from FIG. 1. The IC 104 includes a lead frame package body 120 from which various conductive leads 122 extend. The leads may take the form of downwardly extending springs or some other suitable configuration. An underlying planar surface of the body 120 is denoted at 124 and includes an exposed pad (epad) 126. The epad 126 may take a variety of forms and generally includes a relatively large, contiguous exposed layer of electrically and thermally conductive material such as copper. The epad 126 is used to conduct thermal energy (heat) away from the IC 104 during operation of the IC.

Figure 3:
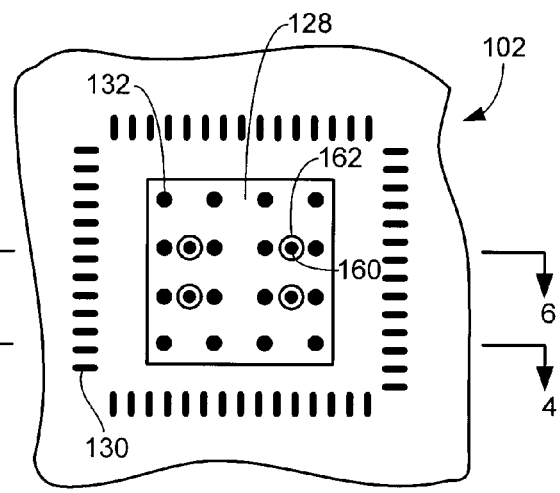
FIG. 3 shows a location on a printed circuit board (PCB) of the PCBA of FIG. 1 adapted to receivingly mount the component of FIG. 1.

FIG. 3 generally illustrates a corresponding portion of the PCB 102 prior to attachment of the IC 104 thereto. FIG. 3 shows the PCB 102 to include a conductive mounting pad 128, also referred to herein as a thermal pad. The thermal pad 128 is generally sized to mechanically correspond to the epad 126 in FIG. 2, although such correspondence is not necessarily required. The conductive pad 128 may be formed of copper or some other suitable electrically and thermally conductive material. A layer of interconnection material, such as a layer of solder paste, is applied during the manufacturing of the PCBA 100 to the conductive pad 128, and this material is reflowed to establish a thermal path for the IC 104 by way of the mechanical and thermal interconnection between the conductive pad 128 and the epad 126.

A number of individual lead interconnection pads 130 surround the conductive pad 128. The lead interconnection pads 130 are arranged so as to be respectively mechanically and electrically interconnected with each of the leads 122 of the IC 104 using individual connection joints (e.g., solder) when the IC 104 is affixed to the PCB 102.

The thermal pad 128 in FIG. 3 incorporates an array of thermal vias 132, represented by small black dots as shown. The thermal vias 132, or PTHs, may be filled or open plated through holes that extend downwardly through the thickness of the PCB 102 from the thermal pad 128. The purpose of the thermal vias 132 is to help draw heat away from the thermal pad 128 and into/through the body of the PCB 102. The thermal vias are thus in physical contact with the thermal pad, and may extend through the pad as shown or may extend from a lower side of the pad.

Figure 4:
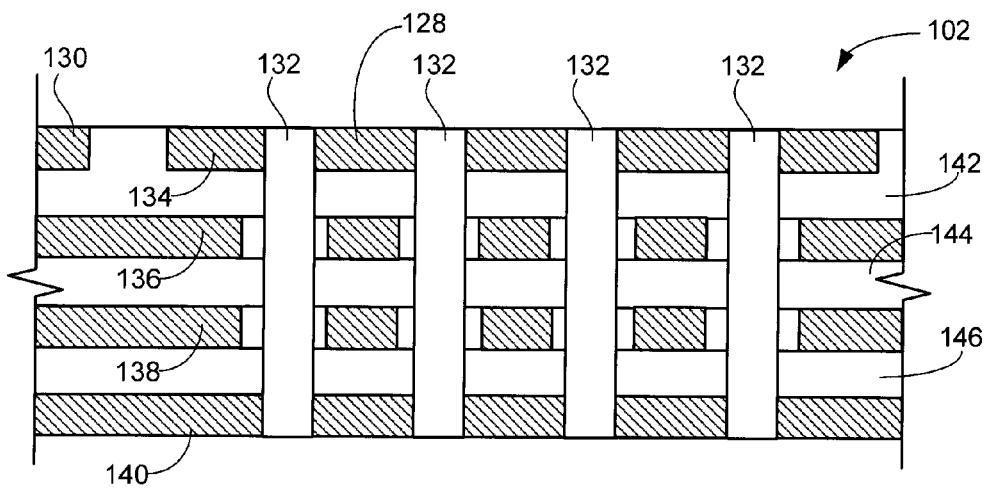
FIG. 4 is an elevational cross-sectional representation of the PCB as viewed along line 4-4 in FIG. 3.

FIG. 4 generally provides a cross-sectional, elevational representation of the PCB 102 along line 4-4 in FIG. 3. The PCB 102 is shown to have four separate conductive layers 134, 136, 138 and 140, with each conductive layer comprising a signal/ground plane, individual traces, or both as required. Layers of insulating material 142, 144 and 146, such as prepreg, support and electrically isolate the respective conductive layers. It will be appreciated that other respective numbers of conductive and insulative layers can be used as desired.

The thermal vias 132 extend downwardly through the thickness of the PCB 102 from the thermal pad 128 to the lowermost conductive layer 140, which in this example serves as an electrical reference (ground) plane. While the thermal vias do not interconnect the intermediate conductive layers 136 and 138, this is merely for purposes of illustration. In alternative embodiments, the thermal vias (or some portion thereof) only extend partially into the thickness of the PCB 102. In still further alternative embodiments, no thermal vias are utilized at all.

Figure 5:
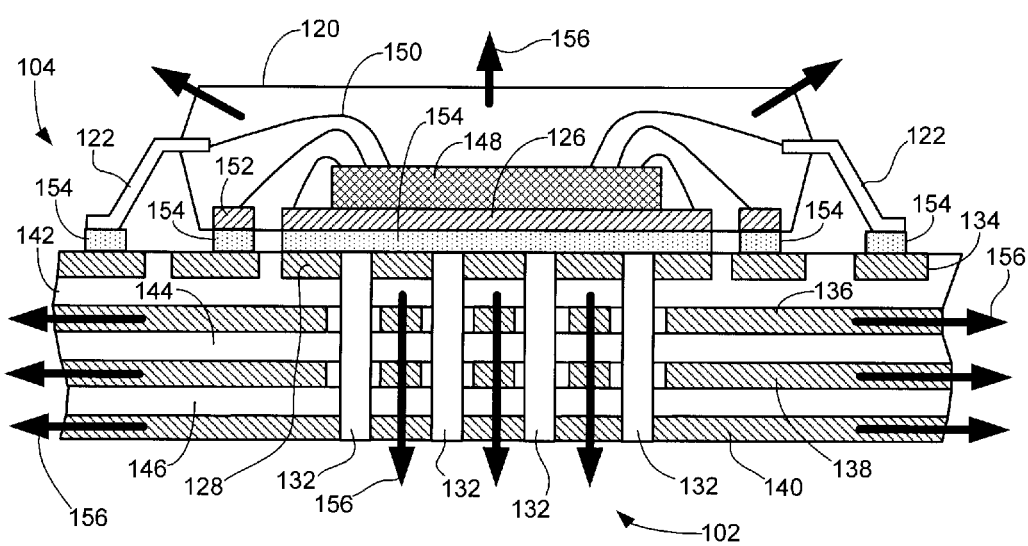
FIG. 5 shows the PCB of FIG. 4 in conjunction with the component of FIG. 2.

FIG. 5 shows the PCB 102 of FIG. 4 with the IC 104 mounted thereto. The IC 104 incorporates an internal die, or solid-state integrated circuit chip 148 which contactingly abuts an upper surface of the epad 126. Internal bond wires 150 interconnect the chip 148 with the conductive leads 122 that extend from the IC body 120. The bond wires can also establish internal connections to the epad 126 as well. As desired, secondary pads such as 152 can extend from the bottom surface of the IC body 120 as shown. It is contemplated that the epad 126 will serve as a reference (ground) plane for the IC and will therefore be maintained at nominally 0 volts, although this is not required.

Interconnecting material 154, such as solder, is used to form a number of interconnections (e.g., solder joints) to electrically and mechanically bond the IC 104 to the PCB 102. The material 154 can be applied as a fluidic solder paste using a solder mask operation and the component IC 102 can be placed onto the solder paste using automated pick and place equipment. The loaded PCBA 100 can thereafter be subjected to a solder reflow operation to melt and harden (reflow) the solder and complete the interconnections.

The epad 126, solder 154, thermal pad 128 and thermal vias 132 serve to provide a thermal pathway to dissipate heat generated by the chip 148 during operation of the IC 104. Various thermal energy paths are generally denoted by heavy arrows 156, which generally indicate the direction of thermal energy dissipation. It will be noted that the thermal vias allow a substantial portion of the thermal energy to be drawn down into and through the PCB 102 so that the heat is sunk along the various conductive layers 134, 136, 138 and 140. Convective or radiant cooling can be applied to the bottommost conductive layer 140 to further draw away heat from the IC 104.

Referring again to FIG. 3, the PCB 102 further incorporates a number of isolated test vias 160. Each test via 160 can be formed as a filled or open plated through hole that extends into and through the PCB 102. Unlike the thermal vias 132, the test vias 160 are electrically isolated from the thermal pad 128 and the other electrically conductive layers of the PCB 102.

Figure 6:
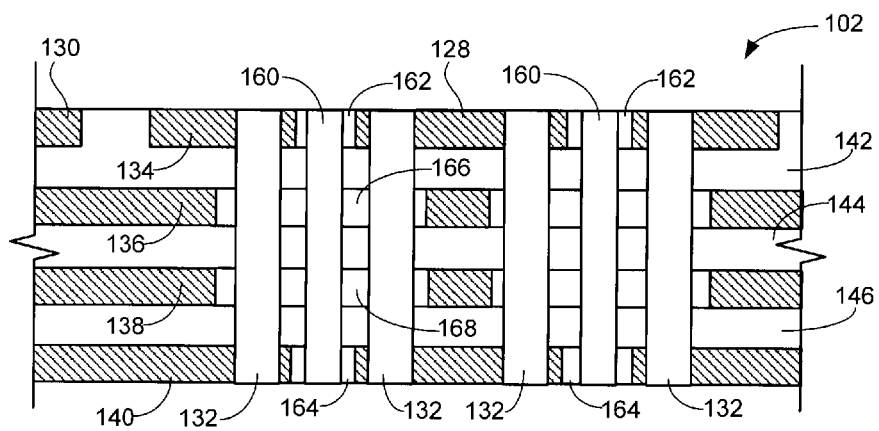
FIG. 6 is an elevational cross-sectional representation of the PCB as viewed along line 6-6 in FIG. 3.

FIG. 6 provides an elevational, cross-sectional representation of the PCB 102 along line 6-6 of FIG. 3. The test vias 160 are arranged in suitable locations among the thermal vias 132. The test vias 160 are electrically isolated from the thermal pad 128 such as through the use of annularly extending air gaps 162 which surround the top portion of each test via 160 along the top surface of the PCB 102.

In a similar fashion, annularly extending air gaps 164 surround the bottom portion of each test via 160 along the bottom surface of the PCB to electrically isolate the test vias 160 from the bottommost conductive layer 140. Additional annular gaps 166, 168 can be used to isolate the test vias 160 from the intermediate conductive layers 136, 138. The various annular gaps 162, 164, 166 and 168 can be filled with insulative material as desired, so long as at least the distal ends of the test vias remain exposed to accept the interconnecting material.

Figure 7:
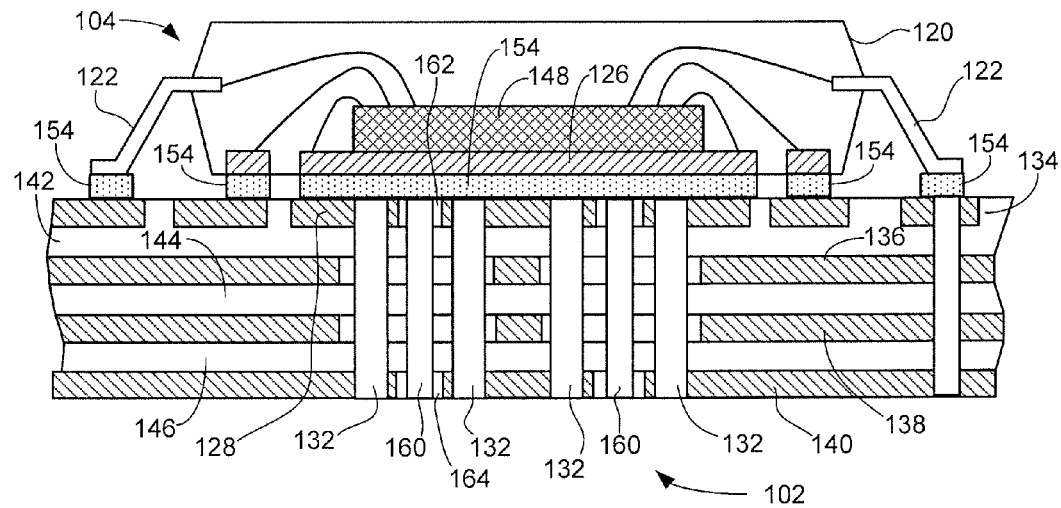
FIG. 7 shows the PCB of FIG. 6 in conjunction with the component of FIG. 2.

FIG. 7 shows the PCB 102 of FIG. 6 in conjunction with the IC 104. As before, the solder interconnection material 154 is shown to fill the entirety of the space between the thermal pad 128 and the epad 126 to establish the aforementioned thermal path. The solder 154 will further ideally contactingly engage the distal ends of each of the test vias 160. The upper air gaps 162 can advantageously provide a space to accommodate entrapped air that might have otherwise created a void in the solder interconnection 154.

Figure 8:
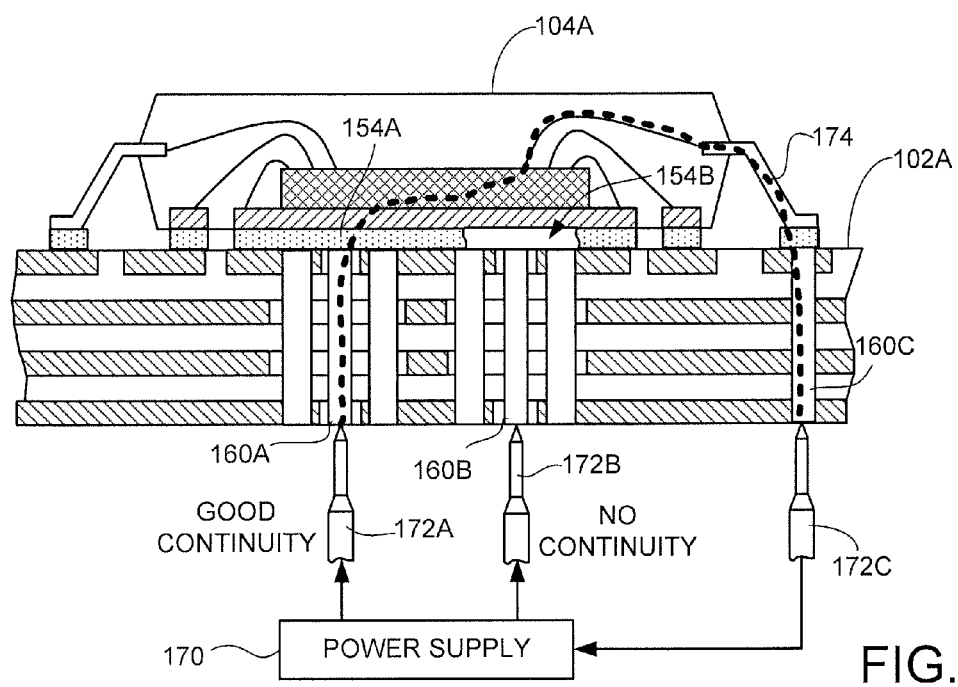
FIG. 8 shows the use of a testing system to assess a coverage characteristic of a connection joint between the PCB and the component.

The integrity of the thermal path can be assessed using the test vias 160, as set forth by FIG. 8. In FIG. 8, a selected IC 104A has been affixed to a selected PCB 102A using solder interconnection material 154A using a normal manufacturing process as described above. This processing results in a localized defect (void) in the solder interconnection material, as denoted at 154B. It is contemplated that this defect cannot be detected using normal visual inspection techniques since the defect 154B is located underneath the body of the IC 104. The void 154B can result from a number of factors such as air entrapment, poor surface wetting, the application of an insufficient quantity of solder paste, etc.

The void 154B can be detected through a testing process that utilizes a power supply 170 and a number of contact probes such as 172A-C. The probes are brought into contact with the various test vias 160A-C, and a relatively low level voltage and/or current is applied by the power supply. This allows the respective connectivity of each of the test vias to be separately assessed.

Signal path 174 shows a good interconnection is established between probes 172A and 172C, indicating that there is good solder coverage in the vicinity of test via 160A. This good interconnection can be sensed in a number of ways, such as by applying a suitable low voltage and measuring the electrical impedance along the path 174. A good interconnection will generally result in a relatively low impedance for this path. The quality of the interconnection can be adjudged by comparing the measured impedance to a predetermined threshold value.

The void 154B, however, will generally result in a high electrical impedance measurement between probes 172B and 172C. This high impedance state indicates that the distal end of the test via 160B remains unconnected to the thermal pad 126 and/or epad 128. It will be appreciated that any number of testing methodologies can be used to carry out such assessments of the thermal path, including the use of automated test fixturing. As desired, 100% of all of the PCBAs 100 formed in each product run can be subjected to this testing.

The number and arrangement of test vias 160 can vary depending on the requirements of a given application. Generally, the greater the number of test vias, the greater the potential resolution that can be made with regard to the coverage assessment. FIGS. 9A-9C illustrate different exemplary layouts that can be used for the thermal vias 132 and the test vias 160.

In some embodiments, the connectivity of each test via can be measured in terms of the connection between that test via and a separate connection point on the PCB. For example, each of the test vias 160 adjacent the thermal pad 128 can be separately evaluated by testing the impedance between each of these test vias and the remotely located test via 160C. Based on the respective locations of the test vias, an accurate understanding of the locations and types of defects, if any, can be derived from these impedance measurements. In other embodiments, the conductivity testing can be sequentially applied between each test via and every other test via within the region of the thermal pad 128.

The overall thermal path integrity may be expressed in terms of a percentage. For example, it may be deemed that at least 50% coverage of a particular epad-thermal pad junction may constitute a minimum acceptable level; that is, at least 50% of the areal extent of the epad and the thermal pad needs to be respectively covered by the interconnecting material in order for the thermal path to have sufficient thermal carrying capability. In such case, this 50% value can be correlated to a minimum number of the thermal vias 160 exhibiting good connectivity. It should be noted that the extension of the test vias 160 through the bottommost conductive plane 140 can provide an access point for individual selection of the test vias 160. Other access points can be used as required, however.

FIGS. 10A-10C generally illustrate exemplary conductive material dispositions that can occur during manufacturing of the PCBA 100. For simplicity of illustration, the respective epad 126 and thermal pad 128 have been omitted from these drawings. FIG. 10A generally represents a good interconnection of the solder 154 between the epad and thermal pad with substantially 100% solder coverage.

FIG. 10B generally illustrates an exemplary type of defective interconnection condition in which the solder 154 fails to contactingly engage the epad 126. That is, the solder 154 substantially covers the thermal pad on the PCB 102, but fails to mechanically contact the epad of the IC 104 to any significant extent.

FIG. 10C shows another exemplary type of defective interconnection in which the solder 154 has localized voids. It is contemplated that these and other types of defective interconnections can be readily detected using the testing processes described herein and, in at least some embodiments, the locations and types of defect can be detected as well.

Figure 11A:
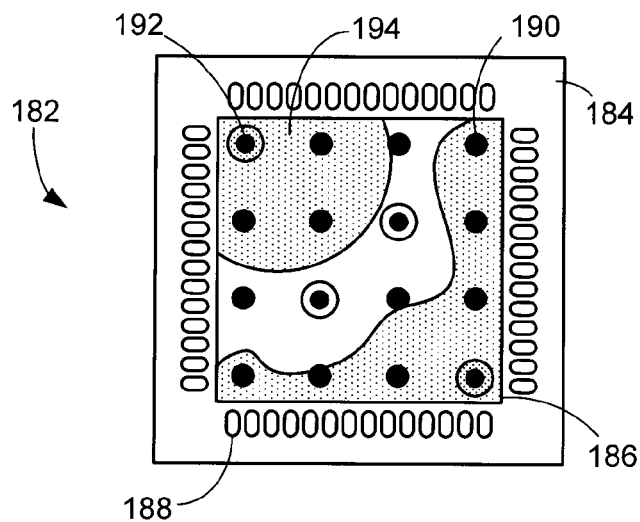
FIGS. 11A-11C show additional different coverage characteristics of an intervening connection joint.
Figure 11B:
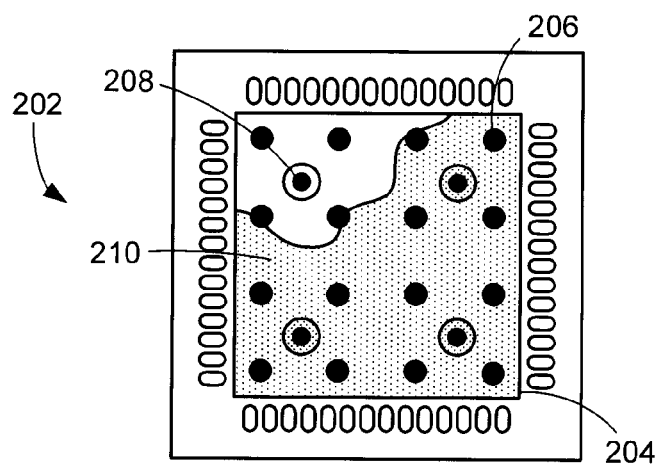
Figure 11C:
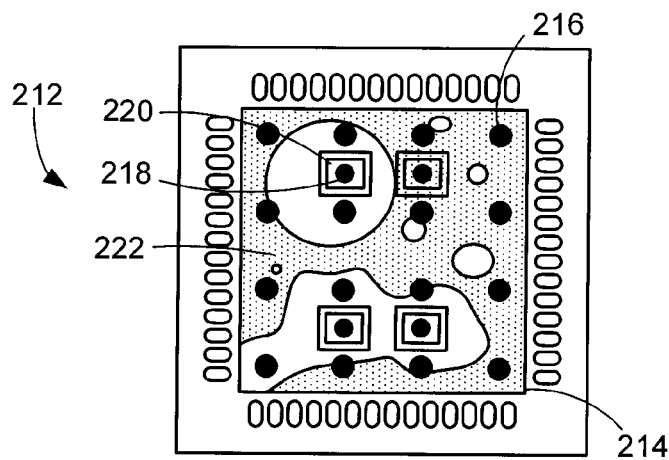

Further exemplary PCB layouts and connection material coverage patterns are illustrated by FIGS. 11A-11C. FIG. 11A shows a PCB 182 substantially similar to the PCB 102 discussed above. The PCB 182 has a primary surface 184 with a conductive thermal pad 186 configured to match dimensions of a corresponding IC to be mounted thereto. The primary surface 184 further supports a number of individual conductive pads 188 that may be connected to the various leads of the IC for operational or testing purposes.

The conductive pad 186 includes respective arrays of thermal vias 190 and test vias 192 as shown. As discussed above, the thermal vias 190 are normally in contacting abutment to the conductive pad 186, and the test vias 192 are normally mechanically and electrically isolated from the conductive pad 186.

After application of a soft conductive material to the conductive pad 186 such as solder paste, the mounting of the IC onto the soft conductive material (not shown), and hardening of the conductive material such as through a reflow operation, hardened conductive material 194 may partially cover the conductive pad 186 as represented in FIG. 11A. That is, the hardened conductive material 194 may cover some of the thermal and test vias 190, 192, while not covering others. The coverage provided by the hardened material 194 can be characterized as two discrete areas of material with a continuously extending void therebetween. It will be noted that the strategic pattern selected for the test vias 192 may affect the ability of the testing process to make a reasonable determination as to the total amount of surface area coverage by the connection material 194, and to make a corresponding determination as to the expected efficacy of the thermal path.

FIG. 11B shows another exemplary PCB 202 with conductive thermal pad 204, thermal vias 206 and test vias 208. A hardened conductive material is represented at 210 and is applied as discussed above. In this case, a majority of the overall surface area of the conductive pad 204 is covered by the material 210 apart from a portion of the upper lefthand corner. The arrangement of the test vias in FIG. 11B may be better suited to that of FIG. 11A with regard to the resolution and accuracy of the testing process.

FIG. 11C shows yet another exemplary PCB 212 with conductive thermal pad 214, thermal vias 216 and test vias 218. It is noted that the test vias 218 and surrounding air gaps 220 take a rectilinear, rather than cylindrical, configuration. A hardened conductive material is represented at 222. In this case, the coverage pattern depicts the localized entrapment of air during the hardening process. As before, the coverage of the material 222 can be readily assessed using the test vias 218 in the manner discussed above.

It should be noted that the various patterns, numbers, and locations of the test and thermal vias discussed herein are merely exemplary and are not limiting. While the amount of acceptable conductive material coverage can be adjusted depending on the PCB operating parameters and manufacturing tolerances, the ability to install a large number of test vias in varying patterns and with one or many different predetermined test areas allows the manufacturer to quickly identify the extent of conductive material coverage on each completed PCBA.

Figure 12:
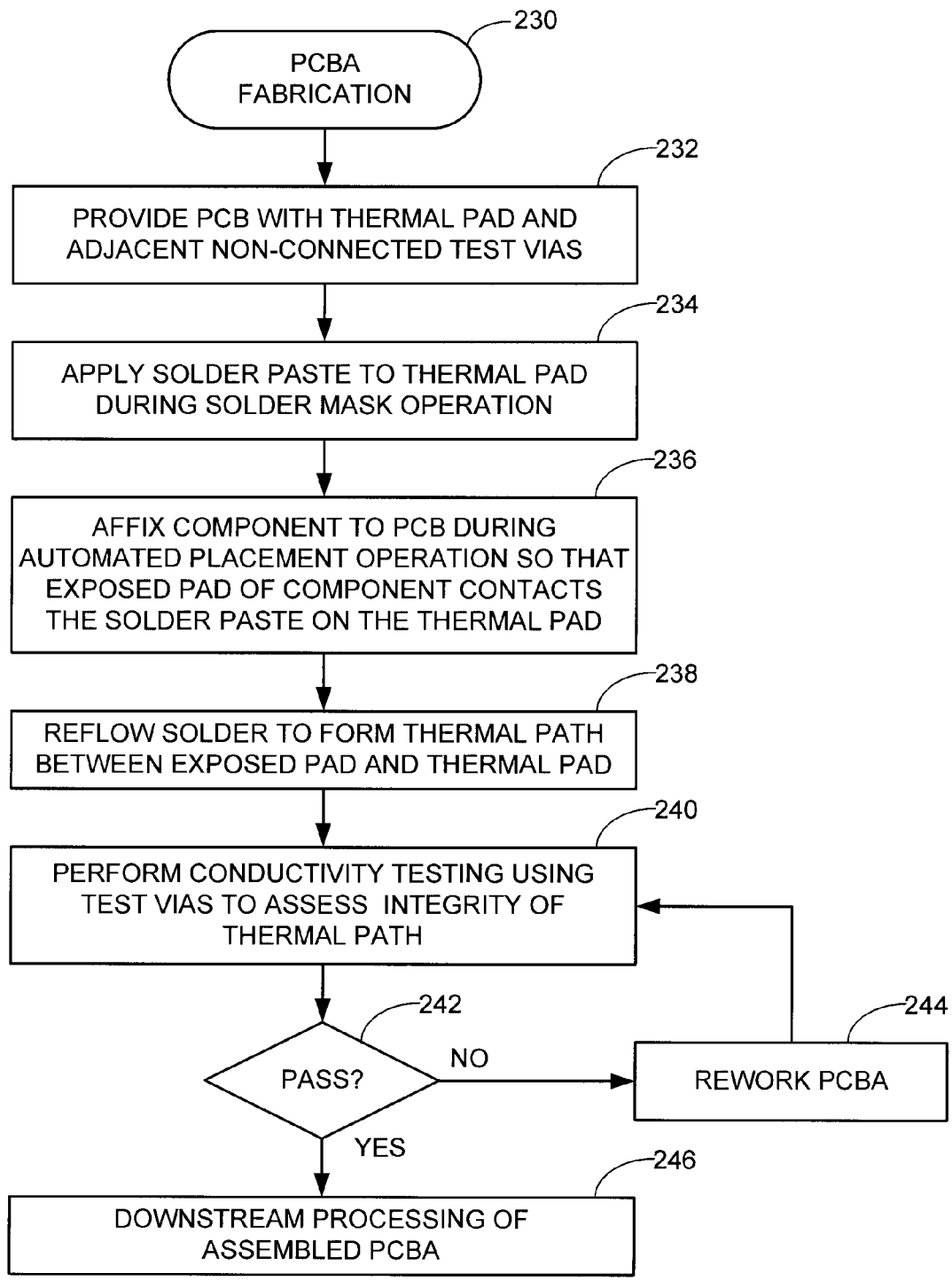
FIG. 12 is a flow chart for a routine that can be carried out in accordance with various embodiments to manufacture a PCBA such as in FIG. 1.

FIG. 12 provides a flow chart for a PCBA FABRICATION routine 230 to set forth various steps that can be carried out in accordance with presently disclosed embodiments of the present invention. While not limiting, the routine 200 is contemplated as representing operation in a large-scale manufacturing environment wherein a large number of PCBAs such as 100 in FIG. 1 are produced.

A PCB is provided at step 232 having a conductive pad and an array of adjacent, non-connected test vias. The pad can also include one or more thermal vias as discussed herein. Any suitable number and pattern of thermal and test vias can be utilized. The pad is sized to accommodate an associated IC for mounting thereon. In the present example it is contemplated that the conductive pad will operate as a thermal pad to provide a thermal path to direct heat away from the IC.

At step 234, a connection material, which in this case constitutes solder paste, is applied to the thermal pad using a solder mask or other suitable operation. The solder paste can be concurrently applied to other locations on the PCB at this time, such as the individual lead connection pads for the IC as well as various pads used to secure other components to the PCB.

A component is next affixed onto the PCB at step 236. This step is contemplated as being carried out by using automated placement equipment to pick and place a multi-pin IC so that an exposed pad (epad) of the IC contactingly engages the layer of solder paste on the thermal pad. A hardening operation, such as solder reflow, is carried out at step 238 to form a hardened interconnection joint between the epad and the thermal pad that forms a portion of a thermal path for the IC.

Conductivity testing is next carried out at step 240 to assess the adequacy of this thermal path. This can be carried out as discussed above by the use of one or more electronic probes that come into contact with the various test vias. A suitable signal is applied, such as a low level voltage and/or current, and an electrical measurement, such as impedance, is obtained.

A determination is next made whether the connection coverage will be sufficient to meet the operational requirements for the assembly, as shown by decision step 242. In some embodiments, a particular unit under test will be deemed to have passed the testing if a minimum number X of the test vias out of a total number of Y of the test vias exhibit adequate measurement values. So for example, a percentage of good connections can be calculated as X/Y (such as X/Y=0.75), and then this value can be compared to a minimum acceptable threshold T (such as T=0.6).

In other embodiments, the unit under test may be found to pass or fail the testing based on individual measurements at particular locations. For example, it is contemplated that, for operational reasons, one or more of the test vias at particular location(s) must have a minimum impedance (or some other measured response) in order for the unit to pass the testing. In still further embodiments, the actual measurement values (e.g., 1000 ohms v. 10 ohms) may be factored into the test criteria.

If the unit under test is found to not pass the testing criteria, the flow passes from step 242 to step 244 where the PCBA may be reworked to correct the defective condition. The results from the testing may also be used to make adjustments to the upstream processing so that a defective process parameter (e.g., the solder paste application process) is corrected so as to not affect other units in the production run.

On the other hand, when the unit under test is found to have adequate coverage, the flow passes from step 242 to step 244 where the PCBA is subjected to further processing, such as incorporation of the PCBA into a larger assembly, such as a data storage device. It will be appreciated that the routine of FIG. 230 can be carried out on 100% of the PCBAs formed, thereby further ensuring that latent defects are not passed downstream into the manufacturing flow. However, as desired the testing process can be carried out on a sample basis.

The various embodiments discussed herein can provide a PCBA that is capable of being efficiently tested to detect the extent and quality of an interconnection of portions of the PCB and an externally mounted IC. It will be appreciated, however, that the construction and testing methodologies disclosed herein can be used in other types of printed circuit boards, such as flexible (flex) circuits. The various embodiments discussed herein have numerous potential applications and are not limited to a certain field of electronic media or type of data storage devices.

While solder has been identified as a well known connection joint material suitable for use in accordance with the various embodiments presented herein, it will be appreciated that any number of types of connection joint materials can be used, so that the present discussion is not necessarily limited to the assessment of solder coverage between a device and a printed circuit board.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A printed circuit board (PCB) comprising:
a multi-layer structure comprising one or more conductive layers and one or more insulating material layers;
a conductive thermal pad affixed to the multi-layer structure and adapted to be electrically and mechanically connected to an exposed pad of a component by an intervening connection joint to establish a thermal path to dissipate thermal energy from the component;
an isolated test via that extends through the conductive thermal pad in non-contacting relation thereto, the isolated test via adapted to mechanically and electrically contact said intervening connection joint, the isolated test via further extending through the multi-layer structure in non-contacting relation to each of the one or more conductive layers in the multi-layer structure layer; and
in which the conductive thermal pad surrounds the isolated test via and is electrically and mechanically isolated therefrom by an intervening annular air gap which extends into the conductive thermal pad.

2. The PCB of claim 1, in which the test via extends through a thickness of the multi-layer structure of the PCB in a direction normal to a largest planar extent of the conductive thermal pad.

3. The PCB of claim 1, further comprising a thermal via that extends in parallel relation to the test via through the multi-layer structure, the thermal via having a first end that contactingly engages the conductive thermal pad, an opposing second end that contactingly engages a selected conductive layer of the multi-layer structure, and a medial portion between the first and second ends that extends through a thickness of the multi-layer structure.

4. The PCB of claim 1, in which the isolated test via facilitates an assessment of a coverage area of the intervening connection joint through an application of an electrical signal to the test via.

5. The PCB of claim 1, in which the intervening connection joint comprises reflowed solder.

6. The PCB of claim 1 incorporated into a printed circuit board assembly (PCBA) that comprises said component and said intervening connection joint, wherein the intervening connection joint comprises reflowed solder that respectively contactingly engages the exposed pad and the conductive thermal pad, wherein the test via has an electrical response determined in relation to contact between the reflowed solder and a distal end of the test via, and wherein the exposed pad is affixed to a main body portion in axial alignment over and which fully covers the conductive thermal pad.

7. The PCB of claim 1, in which the intervening connection joint comprises a reflowed solder joint providing less than 100% coverage of the exposed pad.

8. The PCB of claim 1, apparatus of claim 1, wherein the isolated test via is adapted to detect less than 100% areal coverage of the intervening interconnection joint between the exposed pad and the thermal conductive pad in relation to an electrical response of the test via.

9. The PCB of claim 1, wherein multiple isolated test vias are positioned in a predetermined pattern within an overall areal extent of the conductive thermal pad, and wherein each of the multiple isolated test vias are surrounded by the thermal conductive pad in non-contacting relation thereto and extend through the multi-layer structure in non-contacting relation to the at least one conductive layer therein.

10. A printed circuit board assembly (PCBA) comprising:
a printed circuit board (PCB) comprising at least one conductive layer, at least one insulating material layer, a conductive thermal pad and an isolated test via that extends in non-contacting relation through both the conductive thermal pad and each conductive layer;
a component having an exposed pad on a main body portion of the component and a plurality of electrical signal leads which extend from the main body portion and surround the exposed pad for interconnection with corresponding pads on the PCB, the main body portion placed over the conductive thermal pad in axial alignment therewith so that the exposed pad is electrically and mechanically connected to the conductive thermal pad by way of an intervening connection joint to form a thermal path to dissipate thermal energy from the component, the test via adapted to facilitate an assessment of a coverage characteristic of the intervening connection joint between the conductive thermal pad and the exposed pad; and
in which the conductive thermal pad surrounds the test via and is electrically and mechanically isolated therefrom by an intervening annular air gap which extends into the conductive thermal pad, and the intervening connection joint spans said air gap.

11. The PCBA of claim 10, in which the test via has a first end that extends adjacent the conductive thermal pad, an opposing second end that extends adjacent in non-contacting relation to a conductive plane of the PCB, and a medial portion between the first and second ends that extends through a thickness of the PCB.

12. The PCBA of claim 10, further comprising a thermal via that extends in parallel relation to the test via, the thermal via having a first end that contactingly engages the conductive thermal pad, an opposing second end that contactingly engages a conductive plane of the PCB, and a medial portion between the first and second ends that extends through a thickness of the PCB.

13. A method comprising:
providing a printed circuit board (PCB) comprising at least one conductive layer, at least one insulating material layer, a conductive thermal pad and an isolated test via that extends in non-contacting relation through both the conductive thermal pad and the at least one conductive layer;

forming an intervening connection joint between the conductive thermal pad and an exposed pad of a component to establish a thermal path to dissipate thermal energy from the component;

applying an electrical signal to the test via to assess a coverage characteristic of the intervening connection joint; and in which the conductive thermal pad surrounds the isolated test via and is electrically and mechanically isolated therefrom by an intervening annular air gap which extends into the conductive thermal pad, and the intervening connection joint spans said air gap.

14. The method of claim 13, in which the forming step comprises applying a layer of solder paste to the conductive thermal pad and heating the layer of solder paste to form the intervening connection joint as a reflowed solder joint.

15. The method of claim 13, in which the intervening connection joint includes a localized discontinuity such that the intervening connection joint does not contact the test via.

16. The method of claim 13, in which the coverage characteristic of the applying step is determined in relation to a measured electrical impedance associated with the test via.

17. The method of claim 13, in which the applying step comprises contacting the test via with a first electrical probe, contacting the PCB with a second electrical probe, and applying a voltage potential across the first and second electrical probes to detect an electrical impedance indicative of a presence or absence of mechanical contact between the intervening connection joint and the test via.

18. The method of claim 13, in which the providing step comprises providing the PCB with multiple isolated test vias positioned in a predetermined pattern within an overall areal extent of the thermal conductive pad, and the applying step comprises sequentially applying electrical signals to each of the multiple isolated test vias in turn to determine a percentage of coverage of said overall areal extent of the thermal conductive pad by the intervening connection joint.

\* \* \* \* \*